(12) United States Patent
Beall et al.

(10) Patent No.: US 7,203,067 B2
(45) Date of Patent: Apr. 10, 2007

(54) APPARATUS FOR SECURING A MODULAR COMPONENT IN A CHASSIS

(75) Inventors: Christopher S. Beall, Seattle, WA (US); Timothy Radloff, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 291 days.

(21) Appl. No.: 10/892,987

(22) Filed: Jul. 16, 2004

(65) Prior Publication Data
US 2006/0012965 A1    Jan. 19, 2006

(51) Int. Cl.
*H05K 7/16* (2006.01)
*F16C 11/00* (2006.01)

(52) U.S. Cl. ............... 361/726; 361/754; 361/798; 361/801; 403/92; 403/93

(58) Field of Classification Search ........ 361/724–727, 361/754, 798, 696, 801; 16/422; 211/26; 403/92, 93, 96, 321, 322.4; 439/153, 157, 439/372
See application file for complete search history.

(56) References Cited

U.S. PATENT DOCUMENTS

| | | | | |
|---|---|---|---|---|
| 4,157,583 A * | 6/1979 | Basmajian et al. | ......... | 361/707 |
| 4,628,413 A * | 12/1986 | Speraw | ......... | 361/798 |
| 4,632,588 A * | 12/1986 | Fitzpatrick | ......... | 403/16 |
| 4,975,073 A * | 12/1990 | Weisman | ......... | 439/157 |
| 5,293,303 A * | 3/1994 | Fletcher et al. | ......... | 361/798 |
| 5,414,594 A * | 5/1995 | Hristake | ......... | 361/755 |
| 5,790,373 A * | 8/1998 | Kim et al. | ......... | 361/685 |
| 5,966,289 A | 10/1999 | Hastings et al. | | |
| 6,279,754 B1 | 8/2001 | Hoss et al. | | |
| 6,311,941 B1 * | 11/2001 | Feldmeyer | ......... | 248/188.8 |
| 6,579,029 B1 * | 6/2003 | Sevde et al. | ......... | 403/322.3 |
| 6,637,843 B2 | 10/2003 | Westwinkel | | |
| 6,749,274 B2 | 6/2004 | Westwinkel | | |

* cited by examiner

*Primary Examiner*—Michael Datskovsky
*Assistant Examiner*—Robert J. Hoffberg
(74) *Attorney, Agent, or Firm*—Haynes and Boone, LLP (57) ABSTRACT

An apparatus for securing a modular component comprises a jointed cam arm including a first portion and a second portion pivotally connected to the first portion. A flexible member is included on the first portion. A pivot limiting catch is included on the second portion, the catch being operable to engage with the flexible member to position the first portion at an angle relative to the second portion. In response to a force applied to the first portion sufficient to flex the flexible member, the first portion is pivotable to reduce the relative angle with the second portion.

23 Claims, 9 Drawing Sheets

APPARATUS FOR SECURING A MODULAR COMPONENT IN A CHASSIS

BACKGROUND

The present disclosure relates generally to information handling systems, and more particularly to securing modular components in an information handling system chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The connection of modular components into information handling systems is an emerging trend. The connection is typically electromechanical in nature, with the electrical connections often established through high density docking connectors on the modular component and the information handling system. These high density connectors tend to have high pin counts, which results in the need for relatively high forces in order to connect the modular component to the information handling system. Typically, a mechanical advantage is designed into the system in order to allow a user to make the connection.

One mechanical solution is a simple lever arm cam design, accessible to the user, to provide the needed mechanical advantage to make the connection. When mechanical system tolerances are considered in relation to the minimum engagement necessary between the modular component and the information handling system to maintain their connection, it is typically necessary to provide an over-mate condition into the system. Providing the over-mate condition into the system can lead to high forces being transmitted back to the user through the lever arm cam once the modular component and the information handling system are fully mated and additional travel is required by the lever arm cam to reach its final position. Between the point when the connectors on the modular component and information handling system are fully connected and the lever arm cam reaches its final position, forces build at a high rate because there is very little compliance left in the system. These high forces can detract from the usability of the design. For example, some securing solutions use a thumb screw to secure the lever arm cam in its final position, and the operation of holding the lever arm cam in place against these forces while trying to engage the thumb screw can be a difficult operation, resulting in a sub-optimal user experience.

Accordingly, it would be desirable to provide an apparatus for securing modular components in an information handling system absent the disadvantages found in the prior methods discussed above.

SUMMARY

According to one embodiment, an apparatus for securing a modular component includes a jointed cam arm including a first portion and a second portion pivotally connected to the first portion. A flexible member is included on the first portion. A pivot limiting catch is included on the second portion, the catch being operable to engage with the flexible member to position the first portion at an angle relative to the second portion. In response to a force applied to the first portion sufficient to flex the flexible member, the first portion is pivotable to reduce the relative angle with the second portion.

A principal advantage of this embodiment is that the apparatus will only transmit force back to the user up to a predetermined limit. Once the predetermined limit is reached, no additional force is transmitted back to the user, increasing the usability of the apparatus.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
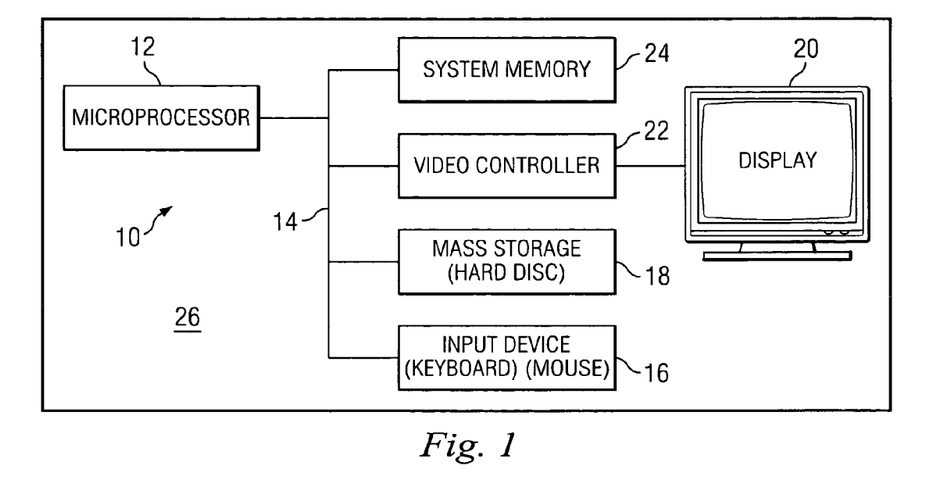
FIG. 1 is a schematic view illustrating an embodiment of an information handling system.
Figure 2:
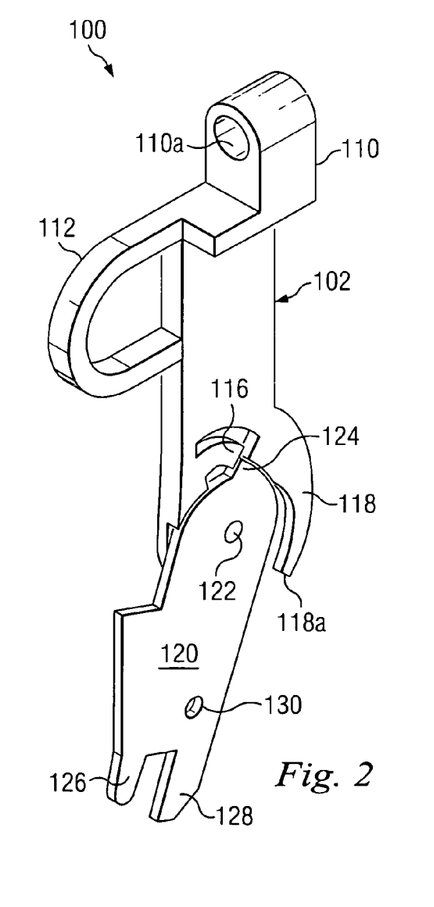
FIG. 2 is a perspective view illustrating an embodiment of an apparatus for securing modular components.
Figure 3A:
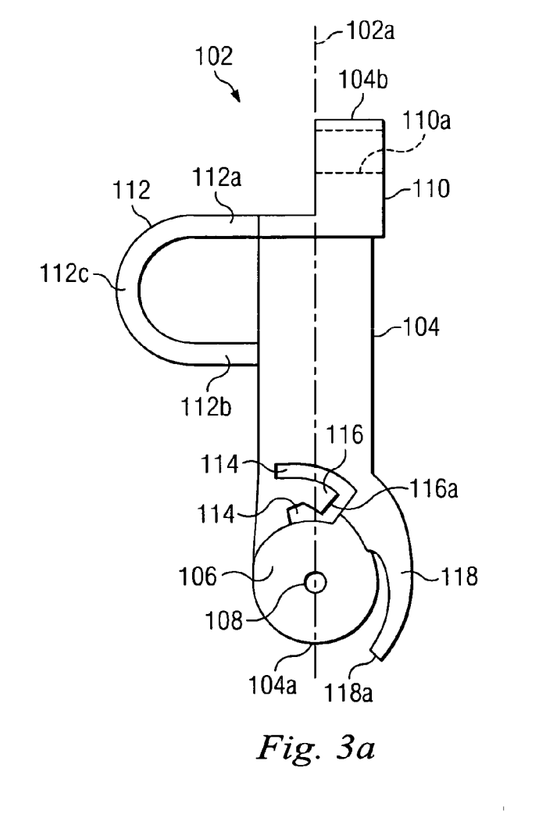
FIG. 3a is a side view illustrating an embodiment of a first portion used on the apparatus of FIG. 2.
Figure 3B:
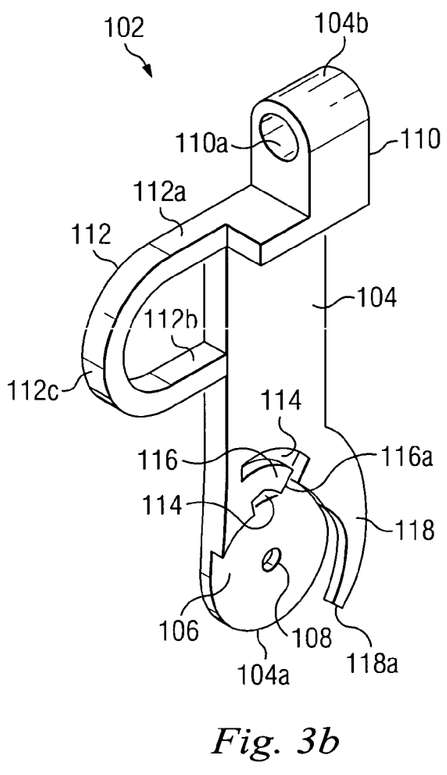
FIG. 3b is a perspective view illustrating an embodiment of a first portion used on the apparatus of FIG. 2.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor. A chassis 26 may be provided for housing some or all of the system 10 components.

Referring to FIG. 2, 3a, 3b, 4a, and 4b of the drawings, an exemplary embodiment of an apparatus 100 for securing modular components includes a first portion 102 with a first portion longitudinal axis 102a. First portion 102 includes an elongated body 104 with a pivoting end 104a and a securing end 104b opposite pivoting end 104a. Elongated body 104 defines a circular channel 106 adjacent pivoting end 104a. Elongated body 104 defines a pivot hole 108 adjacent pivoting end 104a. A securing member 110 is situated adjacent securing end 104b, the securing member 110 defining a passageway 110a. A handle 112 includes an arm 112a and an arm 112b extending from elongated body 104 and an arcuate section 112c coupling the arms 112a and 112b together. A channel 114 is defined by elongated body 104 and is situated adjacent circular channel 106. A beam flexible member 116 extends from elongated body 104 and into channel 114. Beam flexible member 116 includes a beveled surface 116a on a distal end of the beam flexible member 116. A arcuate spring member 118 extends from elongated body member 104, is situated adjacent circular channel 106, and includes a spring member distal end 118a.

Figure 4A:
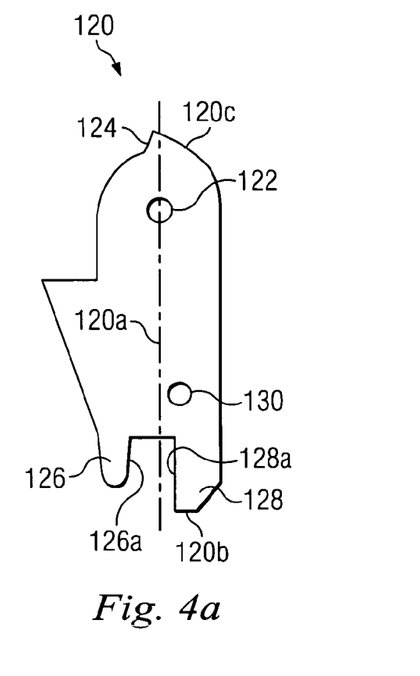
FIG. 4a is a side view illustrating an embodiment of a second portion used on the apparatus of FIG. 2.
Figure 4B:
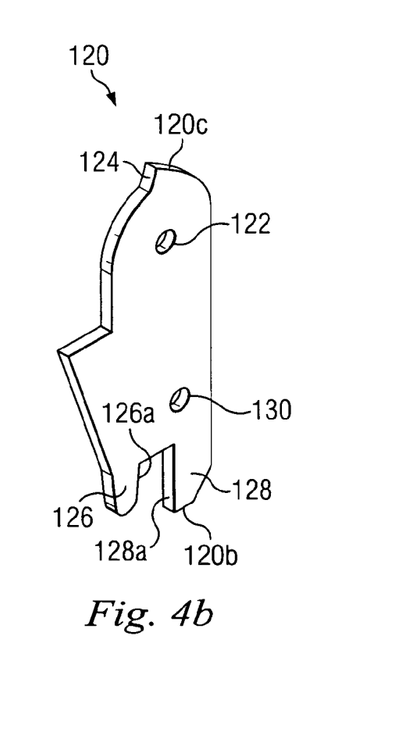
FIG. 4b is a perspective view illustrating an embodiment of a second portion used on the apparatus of FIG. 2.

A second portion 120 with a second portion longitudinal axis 120a includes a cam end 120b and a semi-circular pivoting end 120c opposite the cam end 102a. The second portion 120 defines a system pivoting hole 122 adjacent the semi-circular pivoting end 120c and includes a pivot limiting catch 124 extending from the circumference of the semi-circular pivoting end 120c. The second portion 120 includes a tooth 126 extending from cam end 120b and a tooth 128 also extending from cam end 120b and substantially parallel to tooth 126. Tooth 126 includes a chassis engaging surface 126a, and tooth 128 includes a chassis engaging surface 128a. A component pivoting hole 130 is defined by the second portion 120 and is situated adjacent the cam end 120a and teeth 126a and 128a.

Figure 5A:
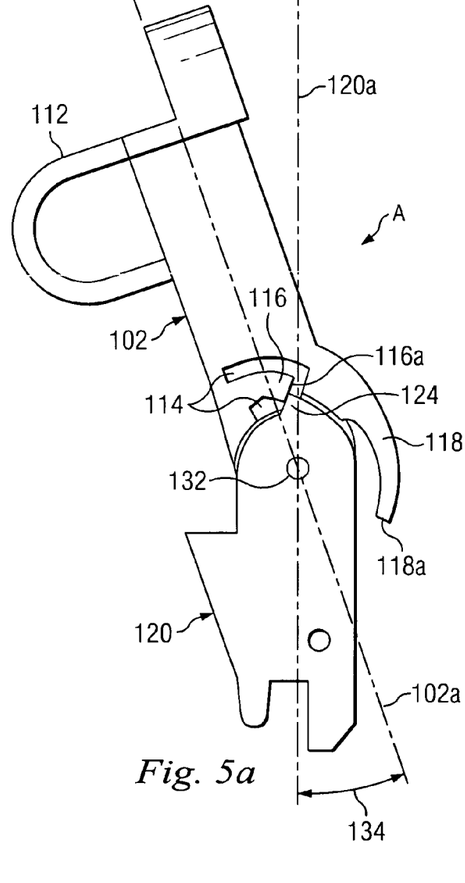
FIG. 5a is a side view illustrating an embodiment of the apparatus of FIG. 2 in a first position.

Referring now to FIGS. 2, 5a, 5b, and 5c, in an exemplary embodiment, during operation of the system 100, first portion 102 and second portion 120 are pivotally coupled to each other by situating a pin 132 in pivot hole 108 on first portion 102 and in system pivoting hole 122 on second portion 120. When pivotally coupled together, semi-circular pivoting end 120c on second portion 120 sits in circular channel 106 defined by first portion 102. The system 100 begins operation in a first position A, as illustrated in FIG. 5a, with second portion 120 being held in a fixed position and with first portion longitudinal axis 102a and second portion longitudinal axis 120a forming a relative angle 134. In position A, pivot limiting catch 124 is situated partially in channel 114 and engaged with beveled surface 116a on beam flexible member 116. Spring member distal end 118a on arcuate spring member 118 is not engaged with second portion 120. In an exemplary embodiment, in position A, spring member distal end 118a on arcuate spring member 118 may already be engaged with second portion 120 to provide a continuous anti-pivoting force to first portion 102 as the apparatus is operated.

Figure 5B:
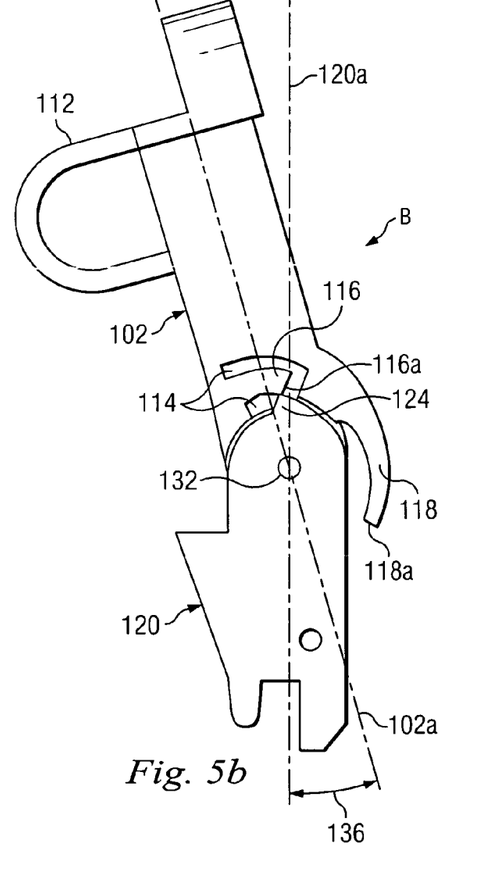
FIG. 5b is a side view illustrating an embodiment of the apparatus of FIG. 2 in a second position.

Beam flexible member 116 is designed such that when a force which is below a predetermined force is applied to first portion 102 through handle 112, that force is translated to second portion 120 through the contact between beveled surface 116a on beam flexible member 116 and pivot limiting catch 124 on second portion 120. When a force is applied to first portion 102 which is above the predetermined force, beam flexible member 116 will begin to displace around pivot limiting catch 124, putting the system in a second position B, as illustrated in FIG. 5b. In position B, the engagement of pivot limiting catch 124 with beveled surface 116a on beam flexible member 116 has displaced beam flexible member 116 into an upper portion of channel 114, allowing first portion 102 to begin to pivot relative to second portion 120 about pin 132. The pivoting of first portion 102 relative to second portion 120 results in first portion longitudinal axis 102a and second portion longitudinal axis 120a forming a relative angle 136 which is less than the relative angle 134 formed in position A. In position B, spring member distal end 118a on arcuate spring member 118 comes in contact with second portion 120 to provide an anti-pivoting force to first portion 102.

Figure 5C:
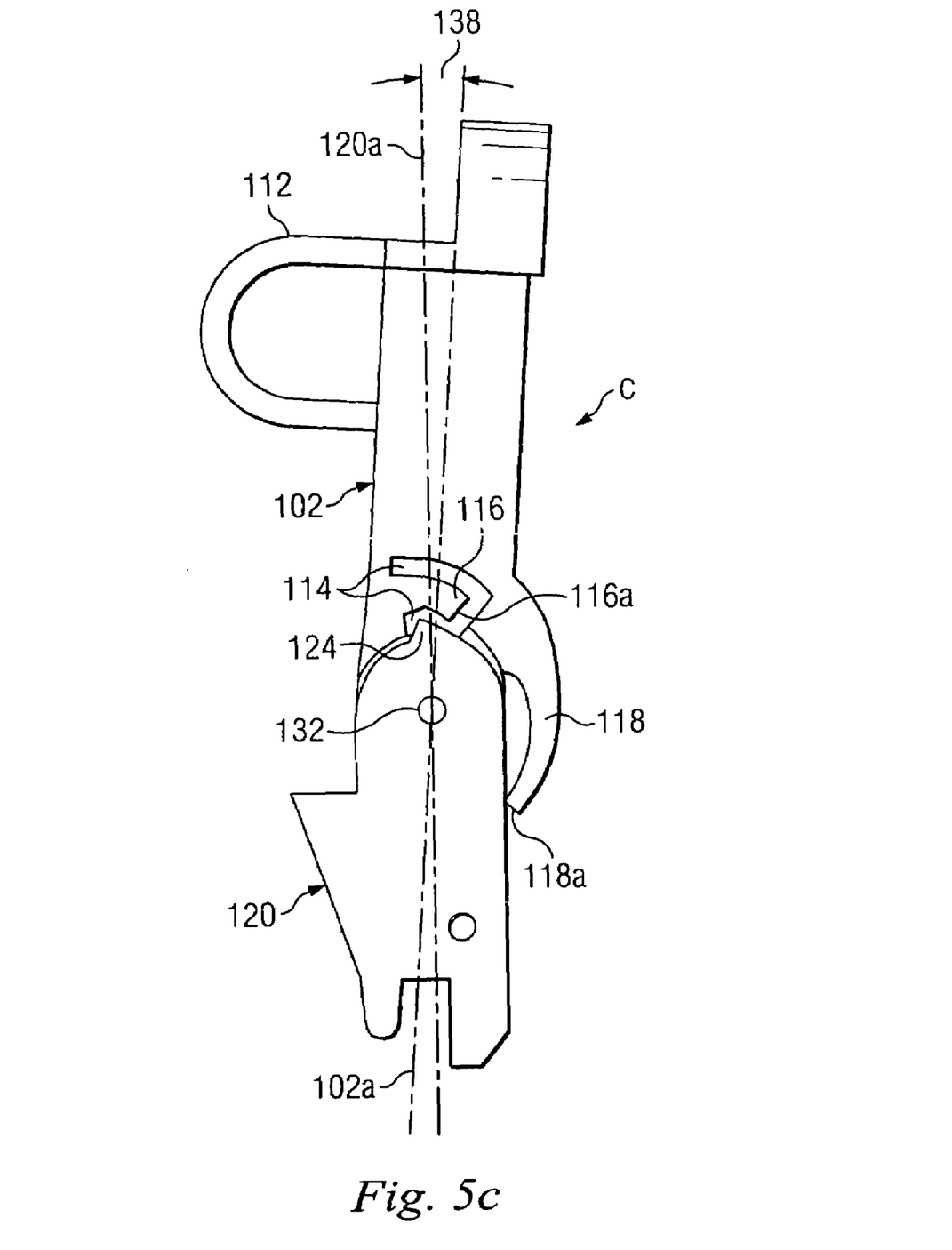
FIG. 5c is a side view illustrating an embodiment of the apparatus of FIG. 2 in a third position.

Further application of the force above the predetermined force to first portion 102 will continue to pivot first portion 102 relative to second portion 120, putting the system 100 in a third position C, as illustrated in FIG. 5c. In position C, first portion 102 has pivoted about pin 132 relative to second portion 120 resulting in first portion longitudinal axis 102a and second portion longitudinal axis 120a forming a relative angle 138 which is less than the relative angle 134 formed in position A. Pivot limiting catch 124 has rotated such that it is no longer in contact with beveled surface 116a on beam flexible member 116, and pivot limiting catch 124 is now situated substantially below beam flexible member 116 on channel 114. Arcuate spring member 118 continues to apply an anti-pivoting force to first portion 102 through engagement of spring distal end 118a with second portion 120.

Referring now to FIGS. 6, 7, 8 and 9a, an alternative embodiment of an apparatus 200 for securing modular components is substantially identical in structure and operation to the apparatus 100 for securing modular components described above with reference to FIGS. 1, 2, 3a, 3b, 4a, 4b, 5a, 5b, and 5c with the addition of a modular component 202 and a component accepting member 204 on the chassis 26.

Figure 6:
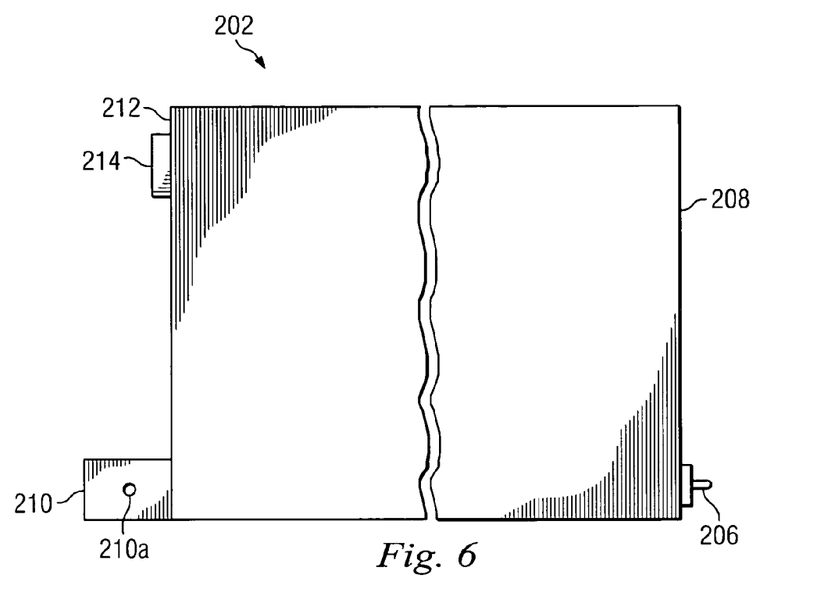
FIG. 6 is a side view illustrating an embodiment of a modular component used with the apparatus of FIG. 2.
Figure 7:
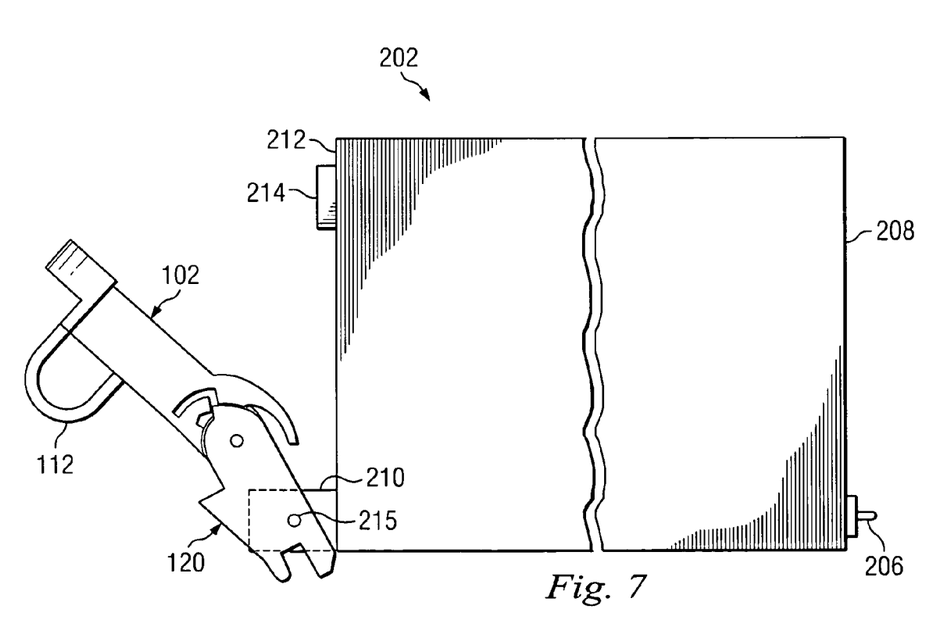
FIG. 7 is a side view illustrating an embodiment of the modular component of FIG. 6 pivotally coupled to the apparatus of FIG. 2.

A modular component 202 includes a component connection 206 extending from a rear surface 208 of the modular component 202. In an exemplary embodiment, component connection 206 is a high density docking connector. A system support member 210 extends from a front surface 212 which is opposite the rear surface 208 and defines a hole 210a. A system securing member 214 is situated on the front surface 212. The second portion 120 is pivotally coupled to the modular component 202 by a pin 215 situated in component pivoting hole 130 on second portion 120 and hole 210a on system support member 210.

Figure 8:
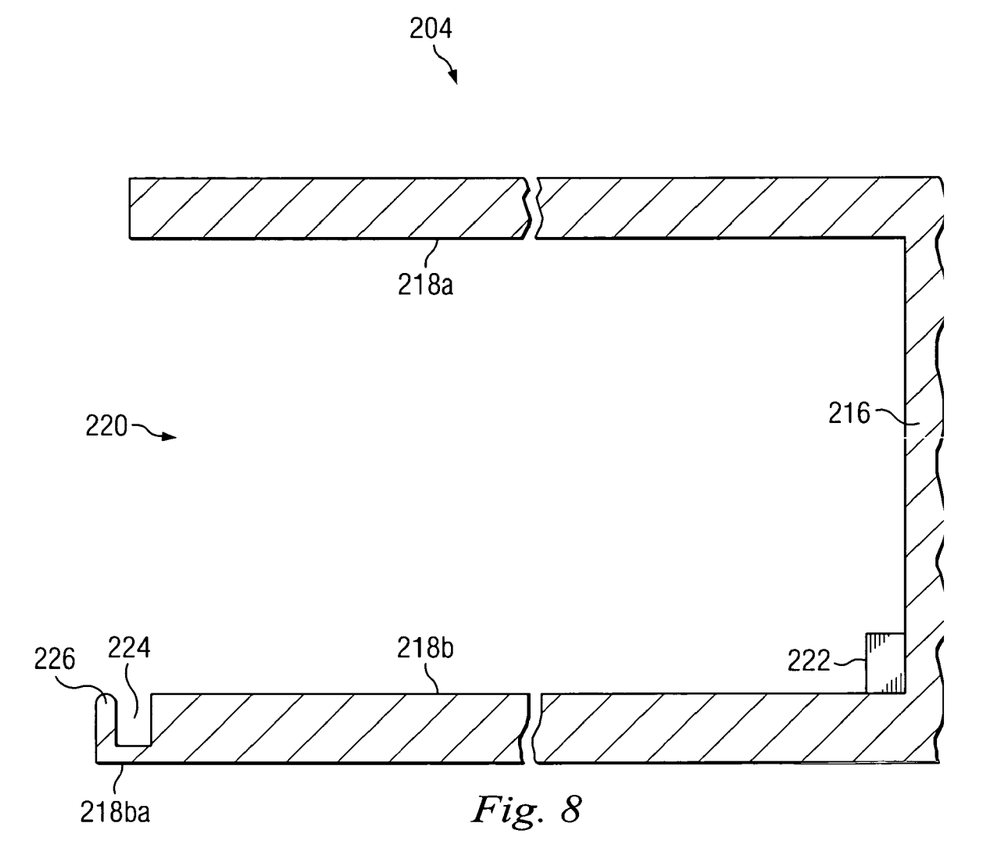
FIG. 8 is a cross sectional view illustrating an embodiment of a chassis for securing the modular component of FIG. 6.

A component accepting member 204 includes a base 216 and a pair of surfaces 218a and 218b extending from the base 216 and defining a cavity 220 in the component accepting member 204. A connector 222 is situated adjacent the base 216 and surface 218b at the rear of cavity 220. In an exemplary embodiment, connector 222 is coupled to the information handling system 10 illustrated in FIG. 1. The surface 218b includes a distal end 218ba which defines a channel 224 and includes a chassis support member 226 adjacent the channel 224.

Figure 9A:
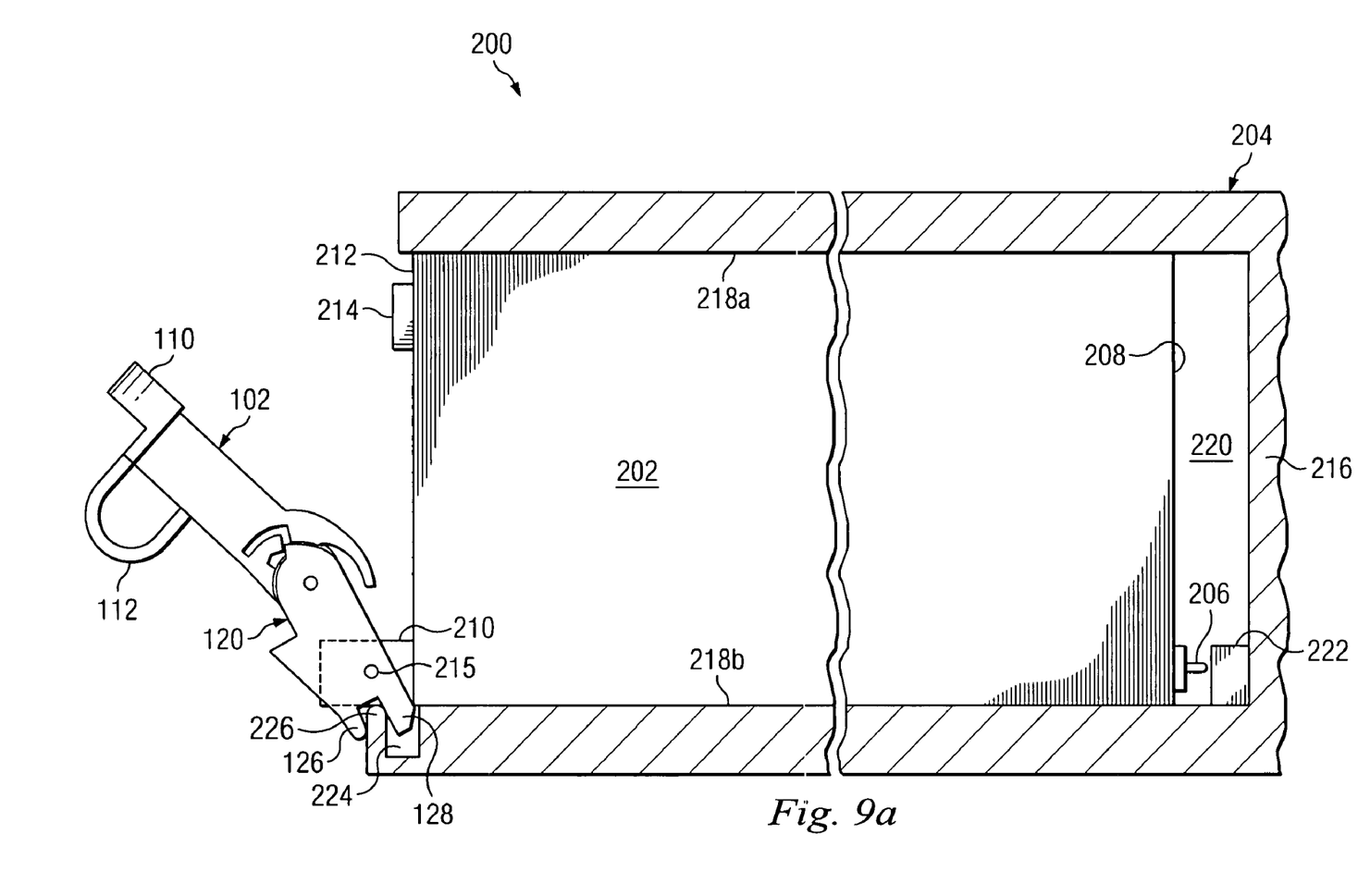
FIG. 9a is a cross sectional view illustrating an embodiment of an apparatus for securing modular components in a first position.

Referring now to FIGS. 2, 3a, 3b, 4a, 4b, 5a, 5b, 5c, 7, 9a, 9b, and 9c, in an exemplary embodiment, during operation of the system 200, the modular component 202 is placed in the cavity 220 of the component accepting member 204, between surfaces 218a and 218b, and rear surface 208 on modular component 202 is slid back toward connector 222 on component accepting member 204. When component connection 206 begins to engage connector 222, chassis engaging surface 126a on tooth 126 of second portion 120 engages chassis support member 226, as illustrated in FIG. 9a.

Figure 9B:
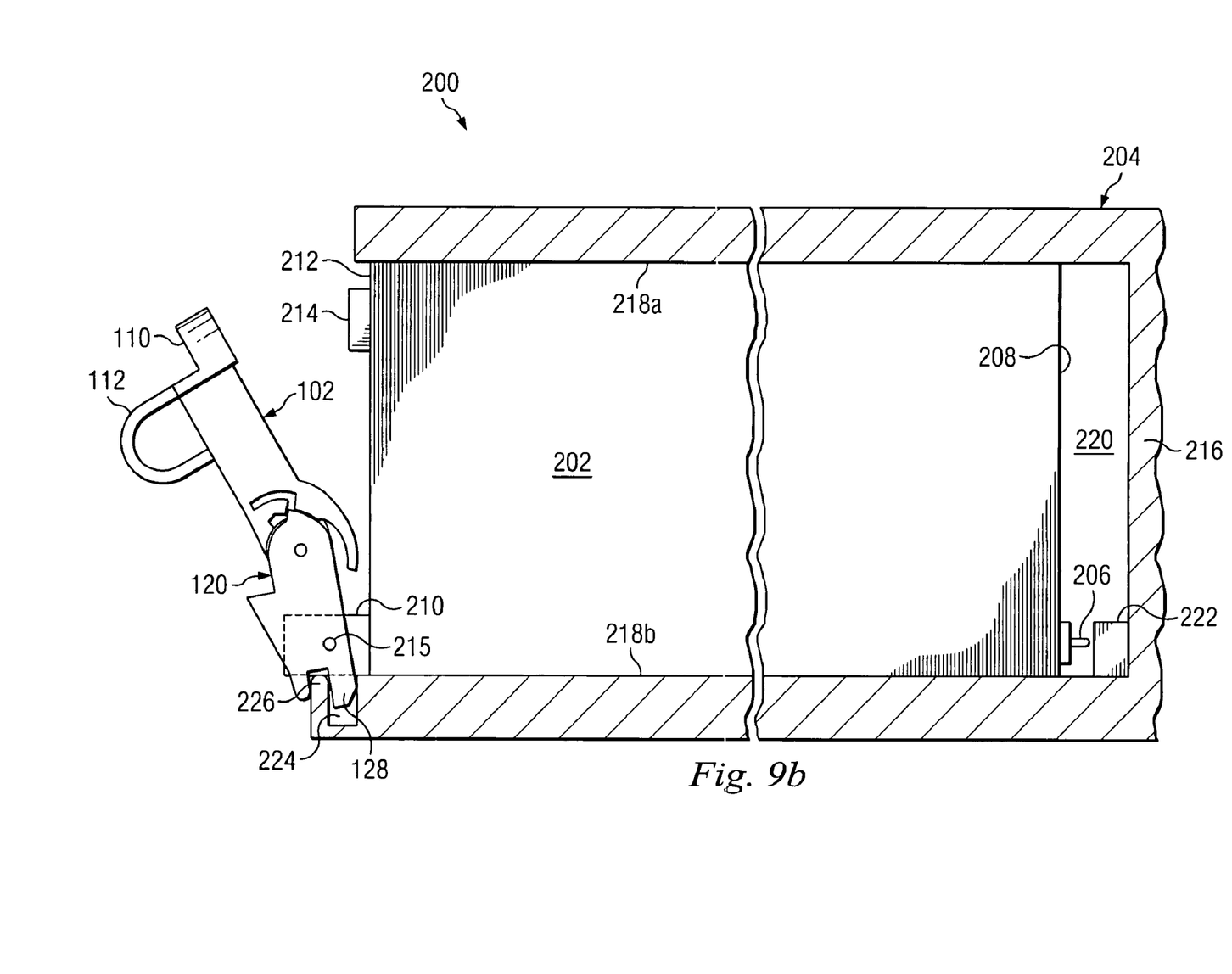
FIG. 9b is a cross sectional view illustrating an embodiment of the apparatus of FIG. 9a in a second position.

Second portion 120 may then be pivoted relative to modular component 202 about pin 215 by applying a force to handle 112 on first portion 102. Pivoting second portion 120 brings tooth 128 into channel 224 and chassis engaging surface 128a on tooth 128 into engagement with chassis support member 226, as illustrated in FIG. 9b. With tooth 128 engaging chassis support member 226, further application of a force to handle 112 on first portion 102 will translate the force applied to handle 112 to chassis support member 226 and begin to mate component connection 206 on modular component 202 into connector 222 on component accepting member 204.

Figure 9C:
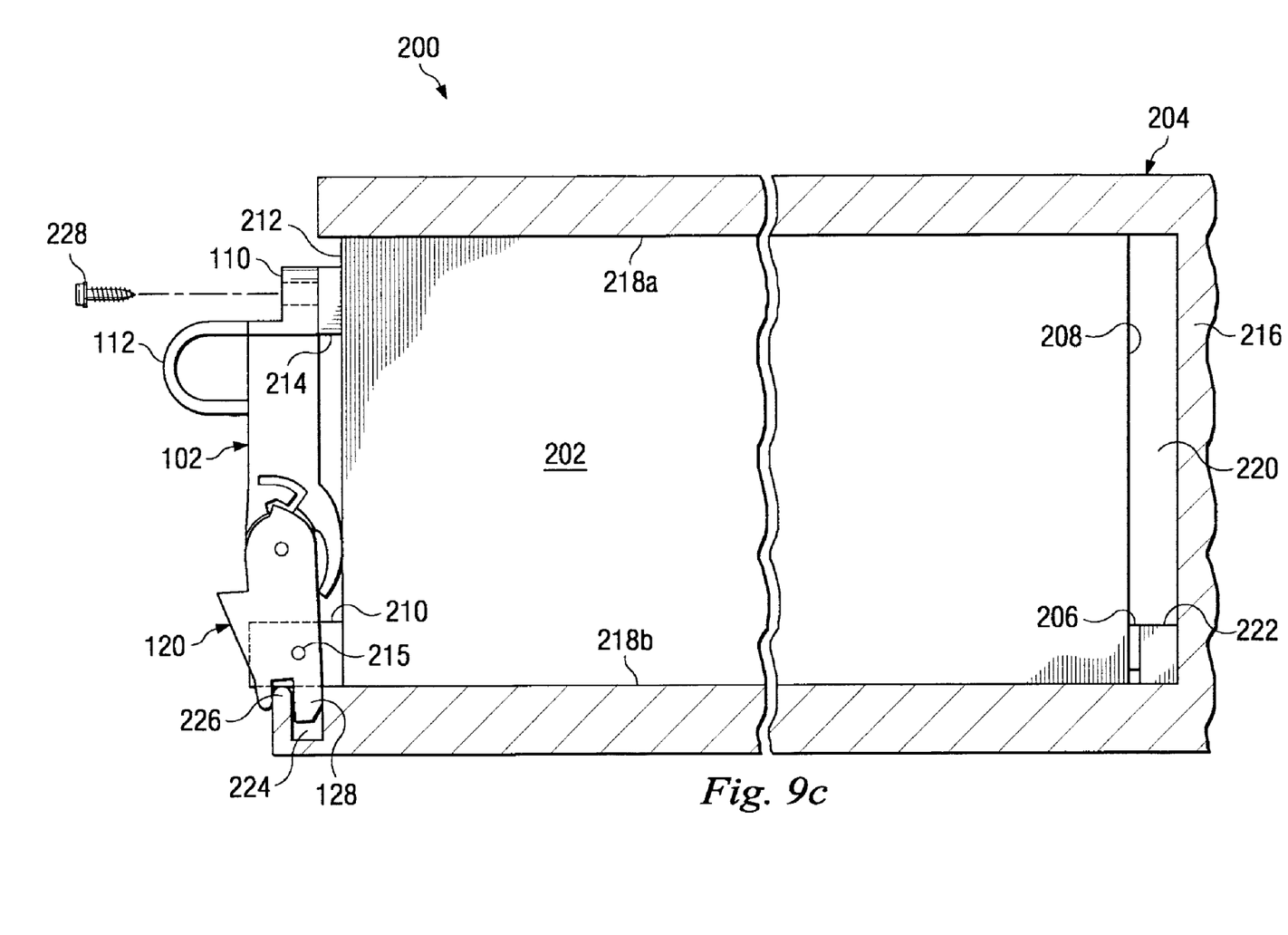
FIG. 9c is a cross sectional view illustrating an embodiment of the apparatus of FIG. 9c in a third position.

Beam flexible member 116 is designed such that when a force which is below a predetermined force is applied to first portion 102 through handle 112, that force is translated to second portion 120 through the contact between beveled surface 116a on beam flexible member 116 and pivot limiting catch 124 on second portion 120. In an exemplary embodiment, the predetermined force is the force required to fully mate component connection 206 with connector 222. When the component connection 206 and connector 222 are fully mated, additional force applied to handle 112 on first portion 102 will exceed the predetermined force, and beam flexible member 116 will begin to displace around pivot limiting catch 124. When beam flexible member has fully displaced around pivot limiting catch 124, as illustrated in FIG. 9c, first portion 102 has pivoted relative to second portion 120 such that securing member 110 is engaging system securing member 214 on modular component 202. In an exemplary embodiment, securing member 110 includes a threaded fastener 228 that may be threaded into internal threads provided on system securing member 214 in order to secure modular component 202 in component accepting member 204 on chassis 26.

It is understood that variations may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for securing a modular component comprising:
  a jointed cam arm including a first portion and a second portion pivotally connected to the first portion;
  a flexible member on the first portion;
  a pivot limiting catch on the second portion, the catch being operable to engage with the flexible member to position the first portion at an angle relative to the second portion and restrict pivoting of the first portion relative to the second portion in order to allow a force that is applied to the first portion to be transmitted to the second portion through the engagement of the catch and the flexible member such that the first portion and the second portion may pivot about a common axis; and
  in response to the force applied to the first portion becoming sufficient to flex the flexible member, the first portion becoming pivotable relative to the second portion to reduce the relative angle with the second portion such that the force transmitted from the first portion to the second portion is reduced.

2. The apparatus of claim 1 further comprising:
  a securing device on the first portion.

3. The apparatus of claim 2 wherein the securing device includes a threaded fastener.

4. The apparatus of claim 1 further comprising:
  a resilient member coupled to the first portion, the resilient member operable to impede the first portion from pivoting relative to the second portion.

5. The apparatus of claim 1 wherein the second portion includes plurality of engagement members being operable to transmit force applied to the first portion.

6. The apparatus of claim 1 wherein the first portion includes a handle.

7. The apparatus of claim 1 wherein the flexible member includes a beam interacting with the pivot limiting catch in order to keep the first portion from pivoting relative to the second portion, whereby upon the application of the force sufficient to flex the beam, the beam displaces relative to the pivot limiting catch in order to allow the first portion to pivot relative to the second portion and reduce the relative angle with the second portion.

8. An apparatus for securing a modular component in a chassis comprising:
  a chassis;
  a modular component situated in the chassis;
  a jointed cam arm coupled to the modular component, the jointed cam arm including a first portion and a second portion pivotally connected to the first portion;
  a flexible member on the first portion;

a pivot limiting catch on the second portion, the catch being operable to engage with the flexible member to position the first portion at an angle relative to the second portion and restrict pivoting of the first portion relative to the second portion in order to allow a force that is applied to the first portion to be transmitted to the second portion through the engagement of the catch and the flexible member such that the first portion and the second portion may pivot about the coupling of the jointed cam arm and the modular component; and in response to the force applied to the first portion becoming sufficient to flex the flexible member, the first portion becoming pivotable relative to the second portion to reduce the relative angle with the second portion such that the force transmitted from the first portion to the second portion is reduced.

9. The apparatus of claim 8 further comprising:
a securing device on the first portion, the securing device operable to secure the modular component in the chassis.

10. The apparatus of claim 9 wherein the securing device includes a threaded fastener.

11. The apparatus of claim 8 further comprising:
a resilient member coupled to the first portion, the resilient member operable to impede the first portion from pivoting relative to the second portion.

12. The apparatus of claim 8 wherein the second portion includes plurality of engagement members being operable to transmit force applied to the first portion to the chassis.

13. The apparatus of claim 8 wherein the first portion includes a handle.

14. The apparatus of claim 8 wherein the flexible member includes a beam interacting with the pivot limiting catch in order to keep the first portion from pivoting relative to the second portion, whereby upon the application of the force sufficient to flex the beam, the beam displaces relative to the pivot limiting catch in order to allow the first portion to pivot relative to the second portion and reduce the relative angle with the second portion.

15. An information handling system comprising:
a chassis;
a microprocessor coupled to the chassis;
a connector situated on the chassis and coupled to the microprocessor;
a modular component for connecting to the connector, the modular component situated in the chassis;
a jointed cam arm coupled to the modular component, the jointed cam arm including a first portion and a second portion pivotally connected to the first portion;
a flexible member on the first portion;
a pivot limiting catch on the second portion, the catch being operable to engage with the flexible member to position the first portion at an angle relative to the second portion and restrict pivoting of the first portion relative to the second portion in order to allow a force that is applied to the first portion to be transmitted to the second portion through the engagement of the catch and the flexible member such that the first portion and the second portion may pivot about the coupling of the jointed cam arm and the modular component; and in response to the force applied to the first portion becoming sufficient to flex the flexible member, the first portion becoming pivotable relative to the second portion to reduce the relative angle with the second portion such that the force transmitted from the first portion to the second portion is reduced.

16. The system of claim 15 further comprising:
a securing device on the first portion, the securing device operable to secure the modular component in the chassis and connected to the connector.

17. The system of claim 16 wherein the securing device includes a threaded fastener.

18. The system of claim 15 further comprising:
a resilient member coupled to the first portion, the resilient member operable to impede the first portion from pivoting relative to the second portion.

19. The system of claim 15 wherein the second portion includes plurality of engagement members being operable to transmit force applied to the first portion to the chassis.

20. The system of claim 15 wherein the first portion includes a handle.

21. The system of claim 15 wherein the flexible member includes a beam interacting with the pivot limiting catch in order to keep the first portion from pivoting relative to the second portion, whereby upon the application of the force sufficient to flex the beam, the beam displaces relative to the pivot limiting catch in order to allow the first portion to pivot relative to the second portion and reduce the relative angle with the second portion.

22. A method for securing a modular component to a chassis comprising:
providing a chassis;
coupling a connector to the chassis;
providing a modular component;
pivotally coupling a jointed cam arm to the modular component, the jointed cam arm including a first portion and a second portion pivotally connected to the first portion;
situating the module component on the chassis;
engaging the jointed cam arm with the chassis; and
pivoting the jointed cam arm to couple the modular component to the connector, wherein prior to application of a sufficient force the jointed cam arm pivots relative to the modular component but the first portion does not pivot relative to the second portion, whereby upon application of the sufficient force the first portion pivots relative to the second portion to reduce the relative angle between the first portion and the second portion and reduce the force transmitted from the first portion to the second portion.

23. The method of claim 22 further comprising:
securing the jointed cam arm to secure the modular component in the chassis.

* * * * *